United States Patent
Roy et al.

(10) Patent No.: US 9,099,603 B2
(45) Date of Patent: Aug. 4, 2015

(54) IMAGE SENSOR OF CURVED SURFACE

(71) Applicant: STMicroelectronics (Crolles 2) SAS, Crolles (FR)

(72) Inventors: François Roy, Seyssins (FR); Vincent Fiori, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 13/858,389

(22) Filed: Apr. 8, 2013

(65) Prior Publication Data

US 2013/0270662 A1 Oct. 17, 2013

(30) Foreign Application Priority Data

Apr. 13, 2012 (FR) ........................................ 12 53425

(51) Int. Cl.
*H01L 21/00* (2006.01)
*H01L 31/18* (2006.01)
*H01L 31/02* (2006.01)
*H01L 27/146* (2006.01)

(52) U.S. Cl.
CPC ............ *H01L 31/18* (2013.01); *H01L 27/1469* (2013.01); *H01L 27/14618* (2013.01); *H01L 31/02* (2013.01); *H01L 27/14632* (2013.01); *H01L 27/14634* (2013.01); *H01L 27/14687* (2013.01)

(58) Field of Classification Search
USPC ........ 438/65–69, 98; 257/291, 431, E21.001, 257/E31.124, E31.127
See application file for complete search history.

(56) References Cited

U.S. PATENT DOCUMENTS

| | | |
|---|---|---|
| 4,290,844 A | 9/1981 | Rotolante et al. |
| 6,285,400 B1 | 9/2001 | Hokari |
| 6,627,865 B1 | 9/2003 | Hamilton, Jr. et al. |
| 7,507,944 B1 | 3/2009 | Arnzen et al. |
| 7,777,260 B2 | 8/2010 | Katsuno et al. |
| 7,935,559 B1 | 5/2011 | Giffard et al. |
| 8,536,667 B2 | 9/2013 | De Graff et al. |
| 8,565,551 B2 | 10/2013 | Choi et al. |
| 2003/0106208 A1 | 6/2003 | Hosier et al. |
| 2008/0151089 A1* | 6/2008 | Street et al. ............. 348/308 |

(Continued)

FOREIGN PATENT DOCUMENTS

| | | |
|---|---|---|
| EP | 2 088 572 A2 | 8/2009 |
| EP | 2 388 987 A1 | 11/2011 |

(Continued)

OTHER PUBLICATIONS

French Search Report and Written Opinion dated Dec. 6, 2012 from corresponding French Application No. 12/53425.

(Continued)

*Primary Examiner* — Charles Garber
*Assistant Examiner* — Abdulfattah Mustapha
(74) *Attorney, Agent, or Firm* — Seed IP Law Group PLLC

(57) ABSTRACT

A method for manufacturing an image sensor, including the steps of: forming elementary structures of an image sensor on the first surface of a semiconductor substrate; installing a layer on the first surface; defining trenches in the layer, the trenches forming a pattern in the layer; and installing, on a hollow curved substrate, the obtained device on the free surface side of the layer, the pattern being selected according to the shape of the support surface.

16 Claims, 4 Drawing Sheets

(56) References Cited

U.S. PATENT DOCUMENTS

| | | |
|---|---|---|
| 2009/0102001 A1* | 4/2009 | Lee .......................... 257/432 |
| 2009/0115875 A1* | 5/2009 | Choi et al. ................. 348/294 |
| 2009/0315044 A1 | 12/2009 | Amundson et al. |
| 2010/0096729 A1 | 4/2010 | Wong et al. |
| 2010/0099225 A1 | 4/2010 | Yamada |
| 2010/0140613 A1 | 6/2010 | Kimura |
| 2010/0207229 A1 | 8/2010 | DeNatale et al. |
| 2010/0308429 A1 | 12/2010 | Ma et al. |
| 2011/0108939 A1 | 5/2011 | Marty et al. |
| 2012/0261732 A1 | 10/2012 | Marty et al. |
| 2013/0181348 A1 | 7/2013 | Oliver et al. |

FOREIGN PATENT DOCUMENTS

| | | |
|---|---|---|
| JP | 2004-349545 A | 12/2004 |
| JP | 2004253509 A | 9/2009 |
| WO | WO 2010094929 A1 | 8/2010 |
| WO | WO 2010141657 A2 | 12/2010 |

OTHER PUBLICATIONS

French Search Report and Written Opinion dated Dec. 19, 2012 from related French Application No. 12/53424.

Rim et al., "The optical advantages of curved focal plane arrays," Optics Express 16(7):4965-4971, Mar. 31, 2008.

* cited by examiner

IMAGE SENSOR OF CURVED SURFACE

BACKGROUND

1. Technical Field

The present disclosure relates to integrated image sensors with a curved surface and, more specifically, to a method for manufacturing such image sensors.

2. Description of the Related Art

An integrated image sensor comprises a large number of elementary cells or pixels which are arranged in an array at the surface of a semiconductor substrate. The image sensor surface is generally planar. To focus the image towards the sensor, an optical system is placed in front of the image sensor.

FIG. 1 schematically illustrates a planar image sensor and an optical focusing system enabling to acquire a high-quality image.

FIG. 1 shows an image sensor 10 and the optical system 12 associated thereto. As can be seen in the drawing, in order for image sensor 10 to detect an image placed at infinity and slightly inclined with respect to the optical axis of the system, optical system 12 integrates a large number of elementary optical devices 14. In the shown example, optical system 12 comprises six elementary optical devices 14 (for example, lenses), which will not be further detailed herein.

Elementary optical devices 14 enable to focus all the incident light rays passing through a diaphragm 16 towards image sensor 10, but also to correct aberrations due to the fact that image sensor 10 has a planar surface.

Indeed, images at infinity, capable of being detected by an image sensor, are naturally focused on a curved surface and not on a plane. The optical system associated with the sensor of FIG. 1 is thus particularly complex, to take into account the fact that the image sensor is planar.

Image sensors with a curved surface are thus needed.

FIG. 2 schematically illustrates the optics associated with an image sensor having a general curved surface.

In FIG. 2, an image sensor 20 of regular curved surface having its center of curvature located on the sensor illumination side is schematically illustrated. An optical system 22 enables to focus all the incident light rays passing through a diaphragm 16 towards image sensor 20. As illustrated in FIG. 2, due to the curvature of sensor 20, optical system 22 is less complex than optical system 12 illustrated in FIG. 1, and only comprises three elementary optical devices 24.

To obtain an image sensor having a curved surface, it has been provided to form image sensor pixels at the surface of a membrane of a thin semiconductor material, and to then position the thin membrane on a support of curved shape. To improve the deformation capacity of the membrane, a structuration thereof may be provided, at the end of the process, around blocks formed of a large number of pixels. However, membrane structurations performed by etching at the end of the manufacturing method have low-quality interfaces which cannot be restored, wall restoring methods being performed at high temperatures. This implies that sensor pixels close to the etched regions during the structuration may be impossible to use.

Thus, there is a need for a method for manufacturing an integrated image sensor having a curved surface, which overcomes all or part of the disadvantages of known methods.

BRIEF SUMMARY

An embodiment provides a method for manufacturing a curved image sensor, as well as the obtained sensor.

A method for manufacturing an image sensor comprises the steps of: forming elementary structures of an image sensor on the first surface of a semiconductor substrate; installing a layer on the first surface; defining trenches in the layer, the trenches forming a pattern in the layer; and installing, on a hollow curved support, the obtained device, on the free surface side of the layer, the pattern being selected according to the shape of the support surface.

According to an embodiment, the pattern is selected according to the shape of the support surface to provide a fracture-free deformation of the layer in the installation step.

According to an embodiment, the step of trench definition in the layer is followed by a step of trench filling with a material having a high resistance to deformation.

According to an embodiment, the step of installation of the layer on the first surface is followed by a step of thinning of the layer.

According to an embodiment, the trenches cross the layer.

According to an embodiment, the trenches are defined perpendicularly to the layer surface.

According to an embodiment, the method further comprises a step of forming of an interconnection stack on the first surface of the semiconductor substrate before the step of installation of the layer.

According to an embodiment, the support has a hollow spherical cap shape.

According to an embodiment, the pattern of the trenches forms, at the surface of the layer, concentric strips centered on the center of the elementary structures, separate strips which extend on radiuses of a circle having its center corresponding to the center of the elementary structures, rectangles regularly distributed on the surface of a circle having its center located in front of the center of the elementary structures, or a generally circular shape having rectangles of the layer left therein.

According to an embodiment, the support is hollow, in the shape of a cylinder portion with a circular base.

According to an embodiment, the pattern of the trenches forms, at the surface of the layer, parallel strips.

According to an embodiment, the support has an inner disk in the shape of a spherical cap and an outer strip in the shape of a truncated cone.

According to an embodiment, the pattern of the trenches forms, at the surface of the layer, an inner disk within which is defined a regular rosette and an outer strip in which are defined substantially triangular shapes having one side formed of the outer surface of the portions of the rosette defined in the inner disk, and having their two other sides extending until they meet on the circle defining the outer contour of the outer strip.

Another embodiment provides an image sensor comprising a support having a hollow curved surface, a stack of a layer and of a semiconductor substrate extending on the hollow surface of the support, the layer being in contact with the support, trenches being defined in the layer according to a pattern selected according to the surface of the support.

The foregoing and other features and advantages will be discussed in detail in the following non-limiting description of specific embodiments in connection with the accompanying drawings.

BRIEF DESCRIPTION OF THE DRAWINGS

For clarity, the same elements have been designated with the same reference numerals in the different drawings and, further, as usual in the representation of integrated circuits, the various drawings are not to scale.

DETAILED DESCRIPTION

A method for manufacturing a curved image sensor overcoming all or part of the disadvantages of known methods is provided herein.

More specifically, a manufacturing method in which a deformable sensor structure having a high mechanical resistance to large deformations and curvatures is provided to be installed on a curved support is provided.

FIGS. 3 to 7 illustrate results of steps of a method for manufacturing an image sensor according to an embodiment.

Figure 1:
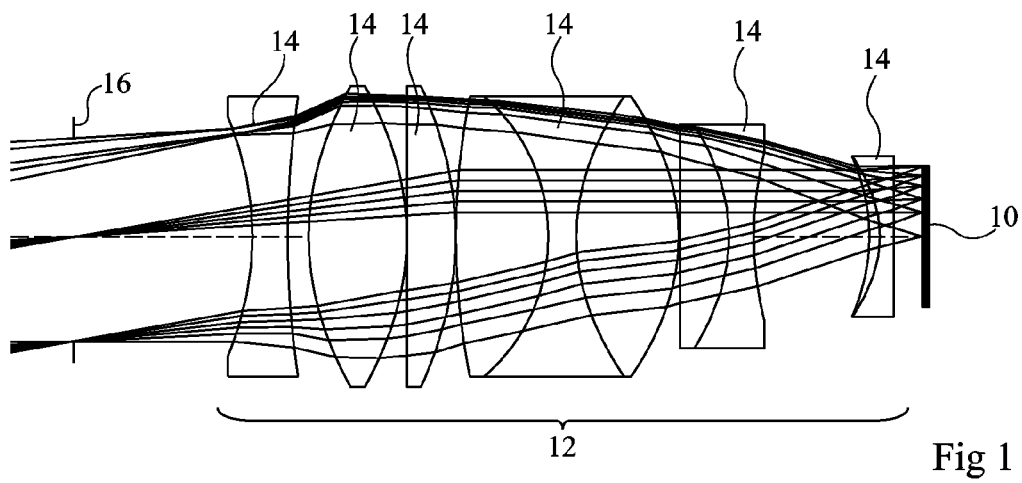
FIGS. 1 and 2, previously described, illustrate optical systems associated with image sensors having a respectively planar and curved general surface.
Figure 2:
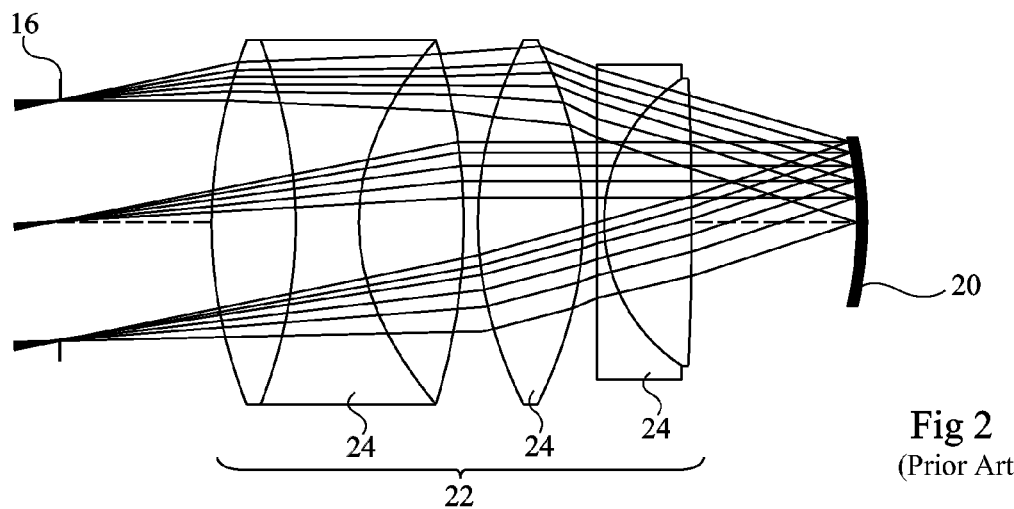
Figure 3:
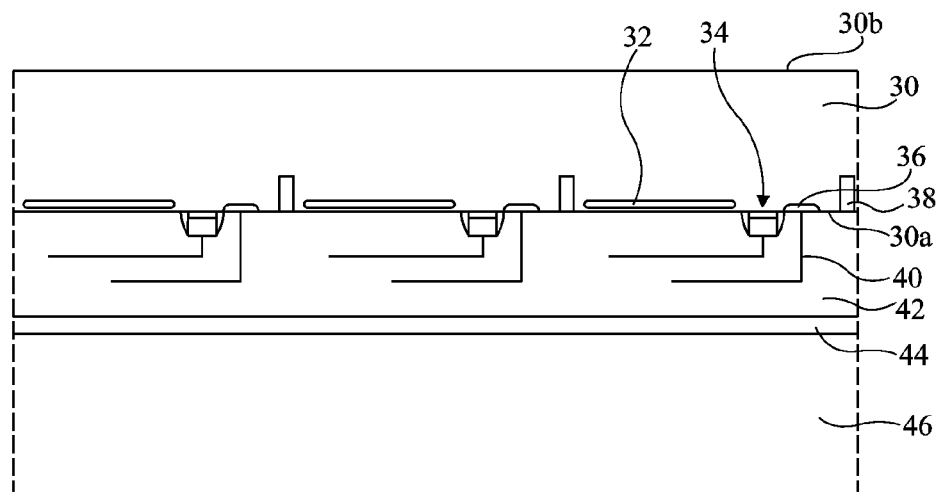
FIGS. 3 to 7 illustrate results of steps of a method for manufacturing an image sensor.

At the step illustrated in FIG. 3, it is started from a device comprising a semiconductor substrate 30 having image sensor pixels formed on a first surface 30a. These pixels are very schematically illustrated in FIG. 3, and each comprise a photodetection area 32, a charge transfer transistor 34, and a read node 36. The pixels are separated in substrate 30 by insulating trenches 38 extending from surface 30a of substrate 30. In the next drawings, the pixels will not be shown in detail, a region 48 integrating all the sensor pixels being shown at the surface of substrate 30. The illumination to be detected reaches the device via a second surface 30b of substrate 30, opposite to first surface 30a.

At the surface of first side 30a of substrate 30 is formed a stack of interconnection levels comprising conductive tracks and vias 40 separated by an insulating material 42. Conductive tracks and vias 40 are provided to connect the different image sensor pixels together and/or to an adapted processing circuit.

A layer 46 is formed at the surface of interconnection stack 40-42. The layer is bonded to the surface of the interconnection stack via a bonding layer 44, for example, made of silicon oxide. As an example, layer 46 may be a wafer of a semiconductor material having a thickness ranging between 600 and 800 µm.

To obtain the structure of FIG. 3, the following successive steps may, for example, be carried out:

forming, at the surface of a substrate 30 which may be solid or of semiconductor on insulator type (better known as SOI), the sensor pixels;

forming an interconnection stack 40-42 at the surface of the pixels;

installing a layer 46 at the surface of interconnection stack 40-42, via a bonding layer 44; and thinning the solid substrate or removing the support of the semiconductor-on-insulator substrate, as well as the intermediate insulator.

Figure 4:
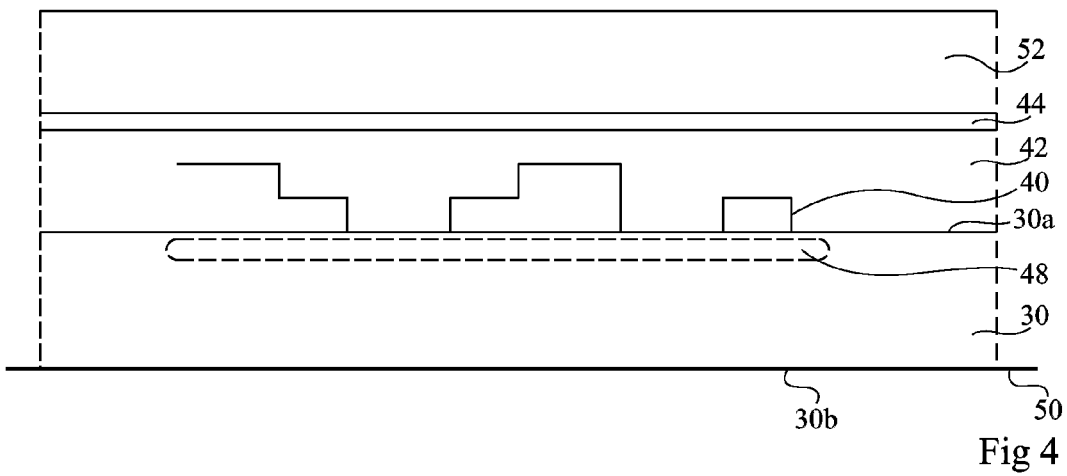

At the step illustrated in FIG. 4, substrate 30 has been bonded, by a temporary gluing method, to a work support 50, via free surface 30b. Work support 50 may, for example, be an adhesive strip conventionally used in microelectronics.

Then, layer 46 has been thinned to only leave a portion 52 thereof having a thickness ranging between 20 and 80 µm.

Figure 5:
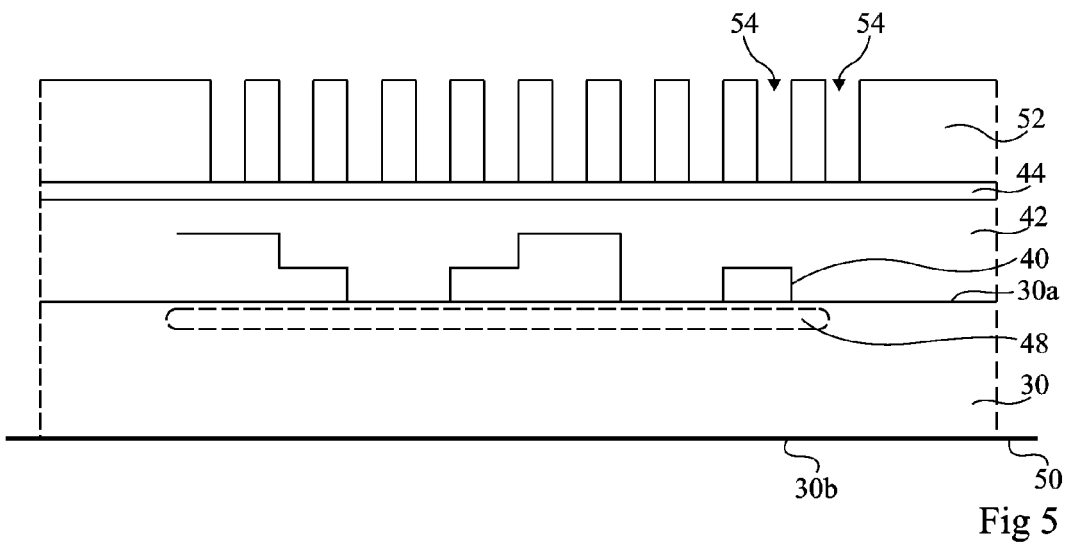

At the step illustrated in FIG. 5, layer 52 has been structured by etching of trenches 54, at least in front of region 48 of the sensor where the pixels are defined. The structure may take several forms, which will be described in further detail in relation with FIGS. 8 to 12 and 13A and 13B. The structuration of layer 52 is carried out to provide a fracture-free curvature of layer 52 and of the image sensor in a subsequent step of application of stress on the device during the installation thereof on the support.

Figure 6:
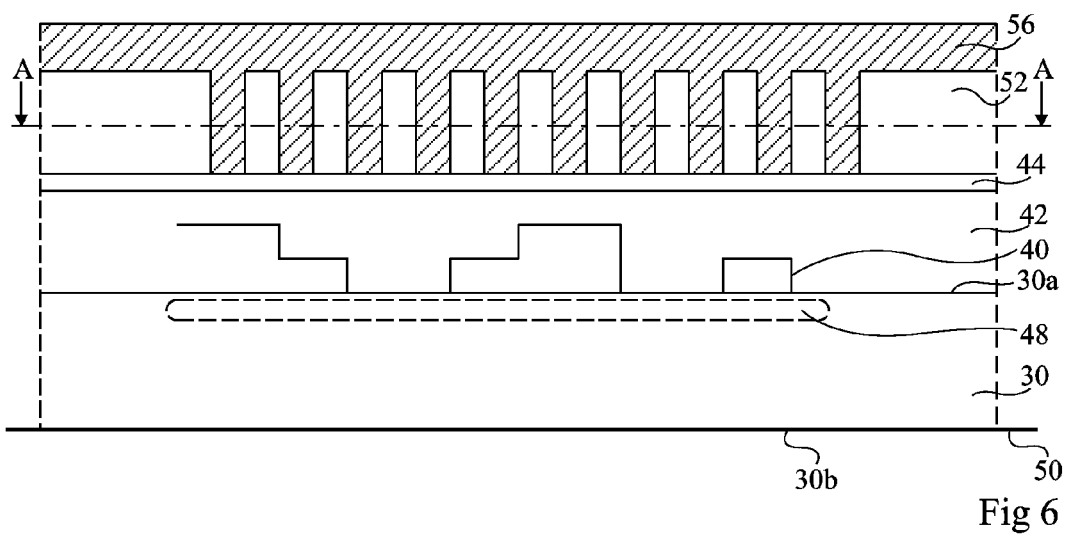

At the step illustrated in FIG. 6, a material 56 has been deposited on the device to fill trenches 54 and to fully cover the device. It should be noted that the step illustrated in FIG. 6 may be followed by a step of etching of material 56 formed at the surface of layer 52.

As an example, material 56 may be a material such as polysilicon, or again a material having a maximum ultimate tensile strain or a highly ductile material (with a minimum plastic modulus), such as polyimides better known under trade name Kapton.

Figure 7:
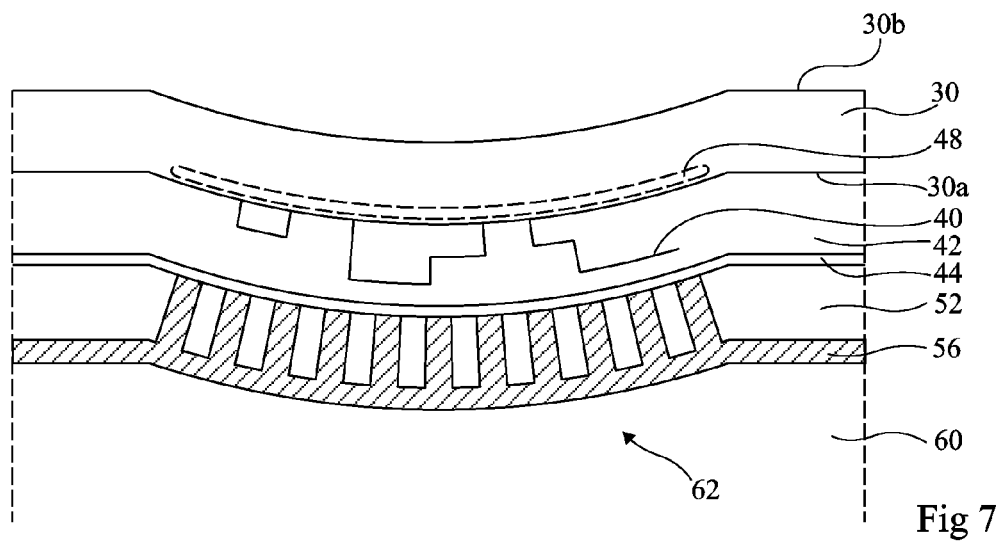

At the step illustrated in FIG. 7, the obtained structure has been placed on a support 60 after which support 50 has been removed. The surface of support 60 has a hollow curved shape, the hollow region having a surface with dimensions substantially equal to those of the surface defined by trenches 54. The shape of trenches 54 is selected to stick to the shape of hollow 62 of support 60.

As will be seen hereafter, the structuration of layer 52 according to a selected pattern provides a fracture-free deformation of the layer, adapted to a deformation corresponding to the specific shape 62 of support 60.

FIGS. 8 to 12 and 13A and 13B illustrate alternative embodiments of an image sensor and, more specifically, alternative embodiments of trenches 54 filled with material 56, corresponding to the desired final deformation of the structure. FIGS. 8 to 12 and 13A are top cross-section views of the device along a plane A-A parallel to the surface of the device illustrated in FIG. 6, this plane crossing trenches 54.

The examples of FIGS. 8 to 11 are provided to stick to supports 60 in which non planar region 62 of support 60 is hollow, in the shape of a spherical cap.

Figure 8:
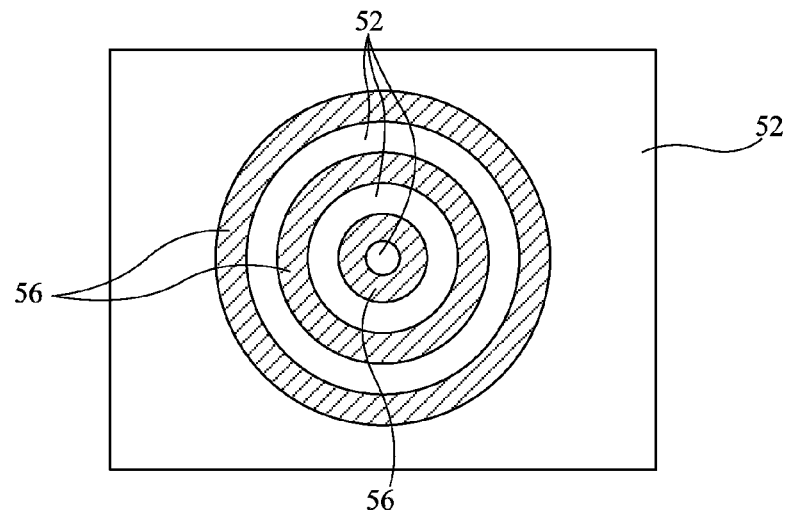
FIGS. 8 and 12 and 13A and 13B illustrate alternative embodiments of an image sensor.

In the example of FIG. 8, trenches 54 of a material 56 are defined to form concentric strips centered on region 48 where the image sensor pixels are defined.

Figure 9:
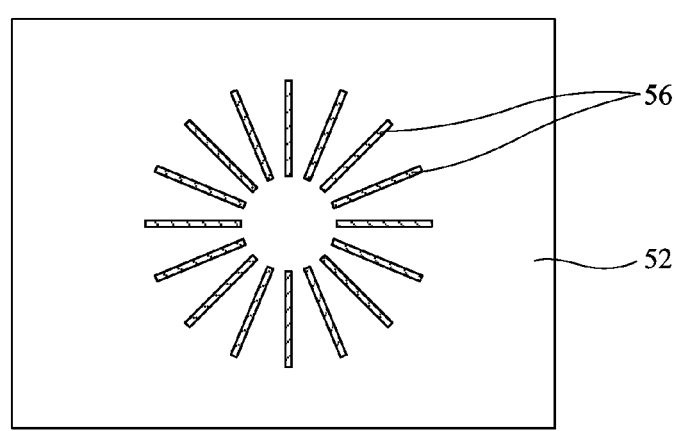

In the example of FIG. 9, trenches 54 of a material 56 are defined to form separate strips which extend on radiuses of a circle having its center corresponding to the center of region 48 where the image sensor pixels are formed.

Figure 10:
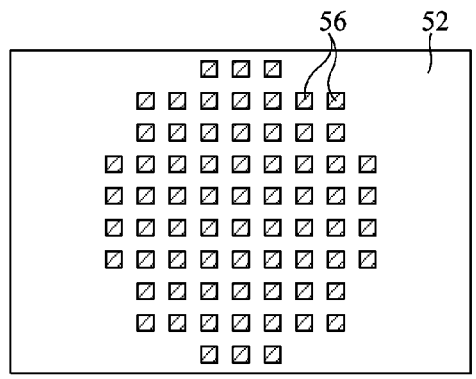

In the example of FIG. 10, trenches 54 of a material 56 form, in top view, rectangles evenly distributed on the surface of a circle having its center located in front of the center of region 48 where the image sensor pixels are formed.

Figure 11:
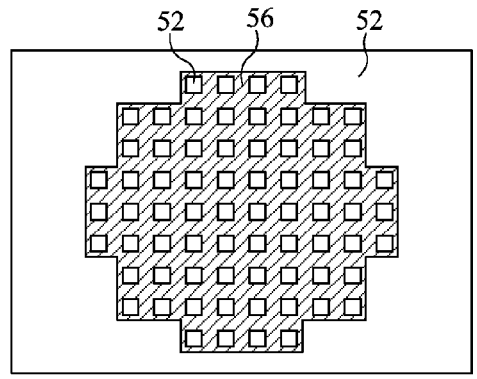

In the example of FIG. 11, trenches 54 of a material 56 are defined to form a generally circular shape centered on the center of region 48 where the image sensor pixels are formed, rectangular columns of the material of layer 52 extending in this generally circular shape.

Figure 12:
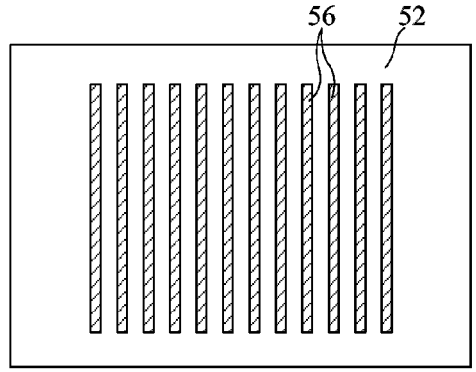

The example of FIG. 12 is provided to stick to a support 60 in which non-planar region 62 of support 60 is hollow, in the shape of a cylinder portion with a circular base.

In the example of FIG. 12, the trenches of a material 56 are defined to form parallel strips which extend in front of region 48 where the image sensor pixels are formed.

Figure 13A:
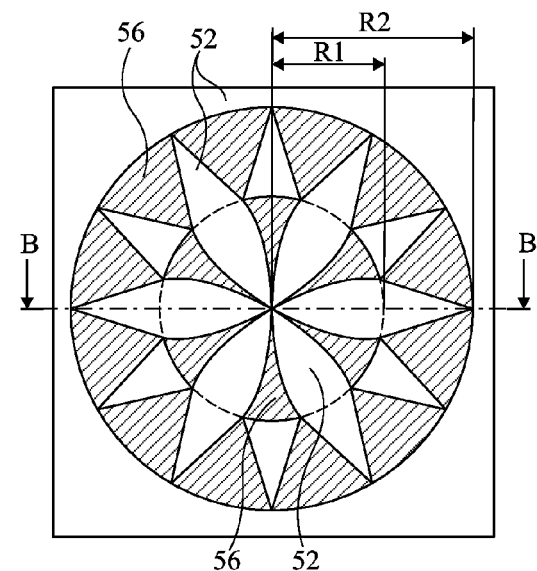
Figure 13B:
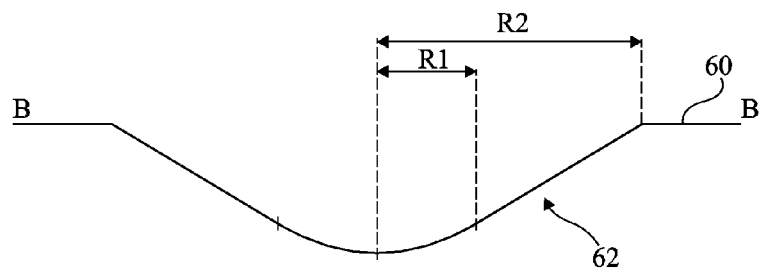

The pattern example of FIG. 13A is provided to stick to a support 60 in which non-planar region 62 is hollow according to a shape shown in cross-section view in FIG. 13B.

In FIG. 13B, hollow surface 62 of support 60 comprises a first central portion, of radius R1, in the shape of a hollow spherical cap, and a second portion peripheral to the first portion, having the same center as the first portion and an outer radius equal to a value R2, in the shape of a truncated cone.

In FIG. 13A, trenches 56 are provided to define, in an inner disk of radius R1, the shape of a regularly distributed rosette in an axial direction. The radius of curvature of the rosette arcs may be variable and depends on the desired final shape of the sensor. This enables to have an uneven curvature of the sensor. The materials of layer 52 and of trenches 56 alternate in the rosette. In an outer strip concentric to the inner disk and of maximum radius equal to R2, trenches 56 form substantially triangular shapes having a side formed of the outer surface of trenches 56 in the rosette defined in the inner disk, and having its two other sides extending until they meet on the circle of radius R2 located outside of the outer strip. The materials of layer 52 and of trenches 56 alternate in this outer strip. As a variation, it may be provided for material 56 in the inner disk to be separate from material 56 in the outer strip.

It should be noted that the method provided herein is also compatible with other methods enabling to improve the deformation of substrate 30 as well as of layer 44 or of any intermediate layer and of interconnection level stack 40/42, for example, by structuration of these elements.

One may also provide, before the step of installation of the device of FIG. 6 on support 60, a step of sawing of the device of FIG. 6 into several independent sensors if such independent sensors are provided at the surface of substrate 30.

Specific embodiments have been described. Various alterations, modifications, and improvements will occur to those skilled in the art. In particular, the materials deposited in trenches 56 may be different from the materials provided herein, as long as they have a high resistance to deformation, for example, having an ultimate tensile strain greater than 0.2%.

Further, it may be provided, instead of filling, at the step of FIG. 6, trenches 56 with a material, to leave the trenches free before deformation.

Different shapes than those provided herein, or forming a combination of the shapes provided herein, may also be provided for trenches 56. It should be noted that, conversely to what has been shown herein, trenches 54 may be defined in inclined fashion in layer 52 instead of perpendicularly to the surface thereof, if such a definition is more adapted to the curvature of support 60 at the end of the process.

Various embodiments with different variations have been described hereabove. It should be noted that those skilled in the art may combine various elements of these various embodiments and variations without showing any inventive step.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for manufacturing an image sensor, the method comprising:
    forming elementary structures of an image sensor on the first surface of a semiconductor substrate;
    forming a layer over said first surface of the semiconductor substrate;
    defining trenches in the layer, said trenches forming a pattern in the layer; and
    conforming the layer to a concave-shaped surface of a support by placing the layer with the trenches in the concave-shaped surface of the support, wherein the trenches prevent the layer from fracturing when conforming to the concave-shape of the surface of the support.

2. The method of claim 1, wherein the pattern is selected to provide a fracture-free deformation of the layer during the conforming step.

3. The method of claim 1, wherein defining the trenches in the layer is followed by filling of said trenches with a material having a high resistance to deformation.

4. The method of claim 1, wherein conforming said layer is followed by thinning said layer.

5. The method of claim 1, wherein the trenches extend through the layer.

6. The method of claim 1, wherein the trenches extend into the layer perpendicularly to a surface of the layer.

7. The method of claim 1, further comprising forming of an interconnection stack on the first surface of the semiconductor substrate before conforming the layer to a concave-shaped surface of a support.

8. The method of claim 1, wherein the support has a hollow spherical cap shape.

9. The method of claim 8, wherein the pattern forms, at a surface of the layer, concentric strips centered on a center of the elementary structures, separate strips that extend on radiuses of a circle having its center corresponding to the center of the elementary structures, rectangles regularly distributed on the surface of a circle having its center located in front of the center of the elementary structures, or a generally circular shape having rectangles of the layer left therein.

10. The method of claim 1, wherein the support is hollow, in the shape of a cylinder portion with a circular base.

11. The method of claim 10, wherein the pattern of the trenches forms, at the surface of the layer, parallel strips.

12. The method of claim 1, wherein the support has an inner disk in a shape of a spherical cap and an outer strip in a shape of a truncated cone.

13. The method of claim 12, wherein the pattern forms, at a surface of the layer, an inner disk within which is defined a regular rosette and an external strip in which are defined substantially triangular shapes having one side formed of the external surface of the portions of the rosette defined in the inner disk, and having their two other sides extending until they meet on the circle defining the external contour of the external strip.

14. An image sensor, comprising:
    a support having a hollow curved surface,
    a stack that includes a layer having a plurality of trenches over a semiconductor substrate, the stack conforming to a concave-shaped surface of a support, said layer being in contact with said concave-shaped surface of said support, wherein the trenches prevent the layer from fracturing when conforming to the concave-shape surface of the support.

15. The image sensor of claim 14, wherein the trenches extend through the layer.

16. The image sensor of claim 14, wherein the trenches in the layer are filled with an insulating material.

* * * * *